United States Patent [19]

Mitomi

[11] Patent Number: 4,862,084
[45] Date of Patent: Aug. 29, 1989

[54] METHOD AND SYSTEM FOR CONTROLLING CHARACTERISTICS OF GRADIENT MAGNETIC FIELDS IN MAGNETIC RESONANCE IMAGING APPARATUS

[75] Inventor: Michio Mitomi, Ootawara, Japan
[73] Assignee: Kabushiki Kaisha Toshiba, Kawasaki, Japan
[21] Appl. No.: 167,511
[22] Filed: Mar. 14, 1988

[30] Foreign Application Priority Data

Mar. 18, 1987 [JP] Japan ................................ 62-63262

[51] Int. Cl.$^4$ .......................................... G01R 33/20
[52] U.S. Cl. ................................... 324/309; 324/307; 324/318
[58] Field of Search ................ 330/297, 202; 335/219; 324/300, 307, 309, 311, 312, 313, 318, 319, 322; 128/653

[56] References Cited

U.S. PATENT DOCUMENTS

| | | | |
|---|---|---|---|
| 4,644,278 | 2/1987 | Sauo et al. ........................ | 324/307 |
| 4,703,275 | 10/1987 | Holland .............................. | 324/318 |
| 4,728,890 | 3/1988 | Pattany et al. ..................... | 324/309 |
| 4,742,311 | 5/1988 | Van der Zwart ................... | 324/309 |
| 4,761,613 | 8/1988 | Hinks ................................. | 324/307 |

OTHER PUBLICATIONS

RCA Transistor, Thryistor, and Diode Manual, RCA Solid State Division, Somerville, N.J., 1971, p. 65.

Primary Examiner—Michael J. Tokar
Attorney, Agent, or Firm—Finnegan, Henderson, Farabow, Garrett, & Dunner

[57] ABSTRACT

In MRI, in order to provide accurate position data of a subject to an MR signal, the characteristics of the gradient magnetic fields are controlled. The characteristics, i.e., rise time $T_r$ of the waveform of a current signal required in generating a gradient magnetic field is described as: $T_r = (Z_l/Z_r) \ln(V/V - I_{out} \cdot Z_r))$, where $Z_l$ is an inductance part of a gradient field generating coil, $Z_r$ is a resistance part of a gradient field generating coil, V is a power source voltage of a gradient field generating power source, and $I_{out}$ is a current supplied to the gradient field generating coil. As impedances of the gradient field generating coils are different from one another, the characteristics, for example, rise time periods, of the gradient magnetic fields are controlled by regulating the power source voltage of a gradient magnetic field generating power source. The characteristics of the gradient magnetic fields are also controlled by making trapezoidal waves.

18 Claims, 4 Drawing Sheets

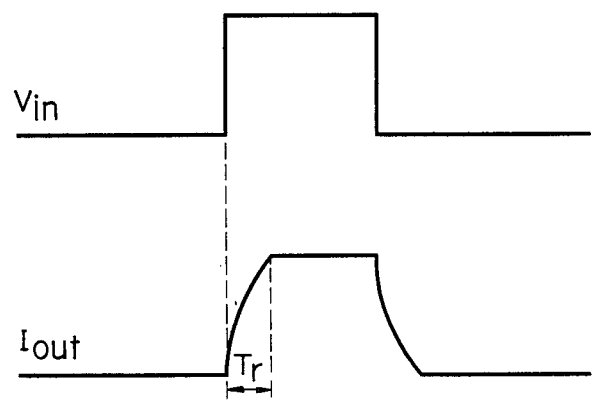
F I G. 2

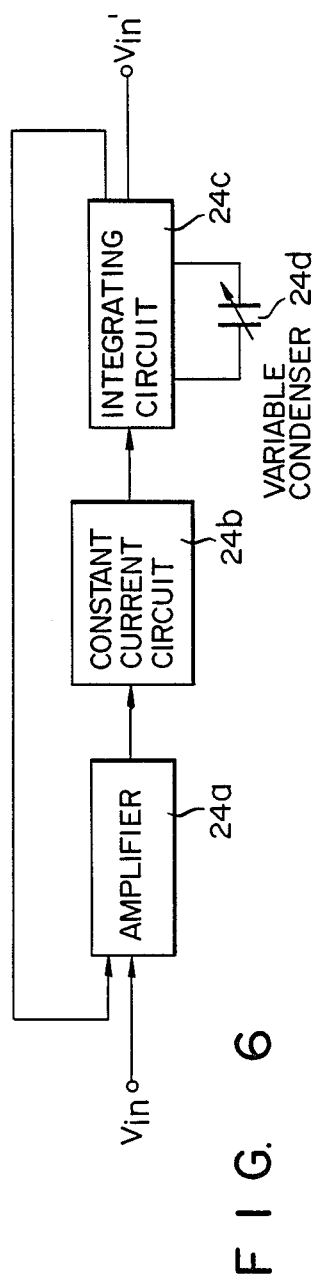
F I G. 6
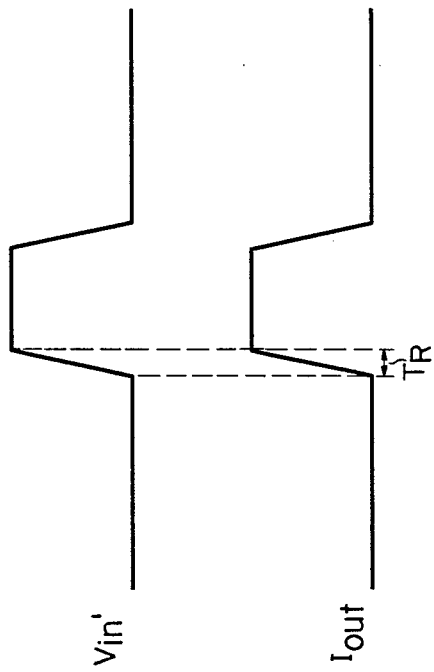
F I G. 7

METHOD AND SYSTEM FOR CONTROLLING CHARACTERISTICS OF GRADIENT MAGNETIC FIELDS IN MAGNETIC RESONANCE IMAGING APPARATUS

BACKGROUND OF THE INVENTION

1. Field of the Invention

This invention relates to a method and a system for controlling the characteristics of gradient magnetic fields generated by a magnetic resonance imaging apparatus.

2. Description of the Related Art

A magnetic resonance imaging (MRI) apparatus comprises a unit for generating a static magnetic field; units for applying gradient magnetic fields (Gx, Gy, Gz) in X, Y, and Z directions, respectively; a transmitter for applying an RF (radio frequency) magnetic field to a subject to be examined; a detector for detecting an MR signal generated within the subject; a sequence controller for controlling the generation of the magnetic fields and the detection of the MR signal; and a computer system for controlling the sequence controller and processing the detected MR signal to produce an MR image.

With the MRI apparatus as described above, the subject is placed in the static uniform magnetic field generated by the static field generating unit. The transmitter is driven in accordance with the sequence operations of the sequence controller to apply a 90° pulse and a 180° pulse to the subject. The gradient field generating units also apply the gradient fields to the subject in accordance with the sequence operations of the sequence controller. As a result, the MR signal generated within the subject by an MR phenomenon, is detected by the receiver. The computer system performs image reconstruction processing for the detected MR signal, thus providing MR imaging information such as an MR tomogram image.

It should be noted here that the MR imaging information is affected by the rise characteristic, for example, the rise time, of the gradient magnetic field applied to provide position information to the MR signal. On the other hand, it may be considered that the rise characteristic of the gradient magnetic field depends mainly on the output characteristics of a power source used for generating the gradient magnetic field. Thus, the output characteristics of the gradient field generating power source will be discussed hereinafter with reference to FIGS. 1 and 2.

FIG. 1 shows a power source for supplying a coil with a power source voltage to generate a magnetic field. An input signal Vin is applied to amplifier 1 operated by voltages $+V$ and $-V$, and amplified therein for supplying coil 2. Coil 2 has an impedance $Z_1$ (an inductance part $Z_{l1}$ and a resistance part $Z_{r1}$). Shunt resistor 3 is provided for measuring a current flowing through coil 2. $I_{out}$ represents a current flowing through coil 2.

The rise time $T_r$ of the current $I_{out}$ flowing through coil 2 is given by $$T_r = (Z_{l1}/Z_{r1})(V/(V - I_{out} Z_{r1})) \quad (1)$$

$$V = Z_{l1}(di/dt) + I_{out} Z_{r1} \quad (2)$$

As can be seen from the above equations, the rise time $T_r$ depends on the impedance Z of coil 2 and the voltage V applied to amplifier 1. As shown in FIG. 2, current $I_{out}$ is delayed by time $T_r$ with respect to input voltage Vin. Thus, when the gradient magnetic field generating coils have various impedances, the rise times of the gradient magnetic fields are varied, thereby failing to provide accurate position information to the MR signal.

Therefore, a method is desired in which the characteristics of the gradient magnetic fields can be controlled so as to provide accurate position information for the MR signal.

SUMMARY OF THE INVENTION

It is an object of this invention to provide a method and a system for controlling the characteristics of gradient magnetic fields to be applied to a subject by a magnetic resonance imaging apparatus.

According to one aspect of the present invention, there is provided a method for controlling characteristics of signals supplied to gradient magnetic field generating coils by operating magnetic field generating power sources, the method comprising the steps of: supplying the signals to the gradient magnetic field generating coils required for generating gradient magnetic fields; controlling the characteristics of the signals by detecting waveforms of the supplied signals, thereby agreeing among the characteristics of the signals; and supplying the signals which have the same characteristic to the gradient magnetic field generating coils so as to generate gradient magnetic fields which have the same characteristic.

According to another aspect of the present invention, there is provided a system for controlling characteristics of signals supplied to gradient magnetic field generating coils by operating magnetic field generating power sources, the system comprising: means for supplying the signals to gradient magnetic field generating coils so as to generate gradient magnetic fields; and means for controlling the characteristics of the signals by detecting waveforms of the signals supplied, thereby agreeing among the characteristics of the signals, and supplying the signals which have the same characteristic to the gradient magnetic field generating coils by the supplying means so as to generate gradient magnetic fields having the same characteristic.

BRIEF DESCRIPTION OF THE DRAWINGS

FIG. 2 shows waveforms of an input voltage and an output current of the power source of FIG. 1;

FIG. 6 is a block diagram of a trapezoidal wave generating circuit; and

FIG. 7 shows waveforms of an input voltage and an output current of the trapezoidal wave generating circuit.

DETAILED DESCRIPTION OF THE PREFERRED EMBODIMENTS

An embodiment of this invention will be described with reference to the accompanying drawings.

Figure 1:
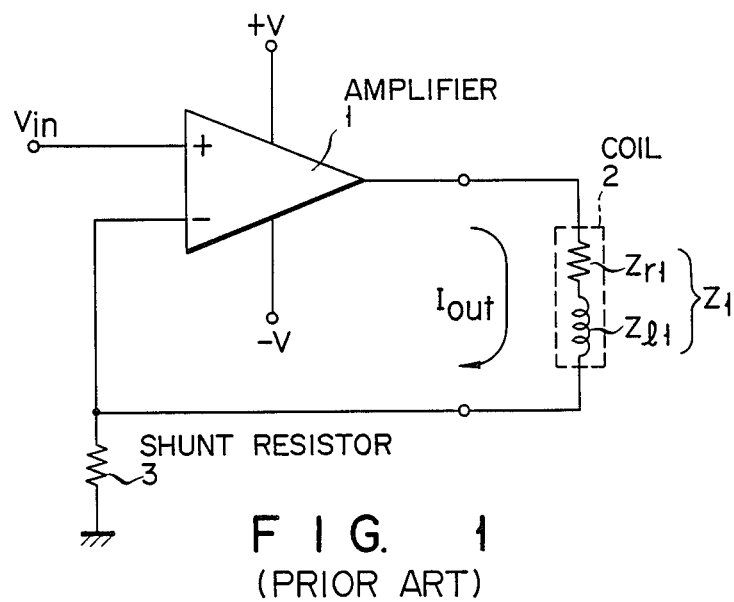
FIG. 1 shows a circuit arrangement of a conventional power source for generating a gradient magnetic field.
Figure 3:
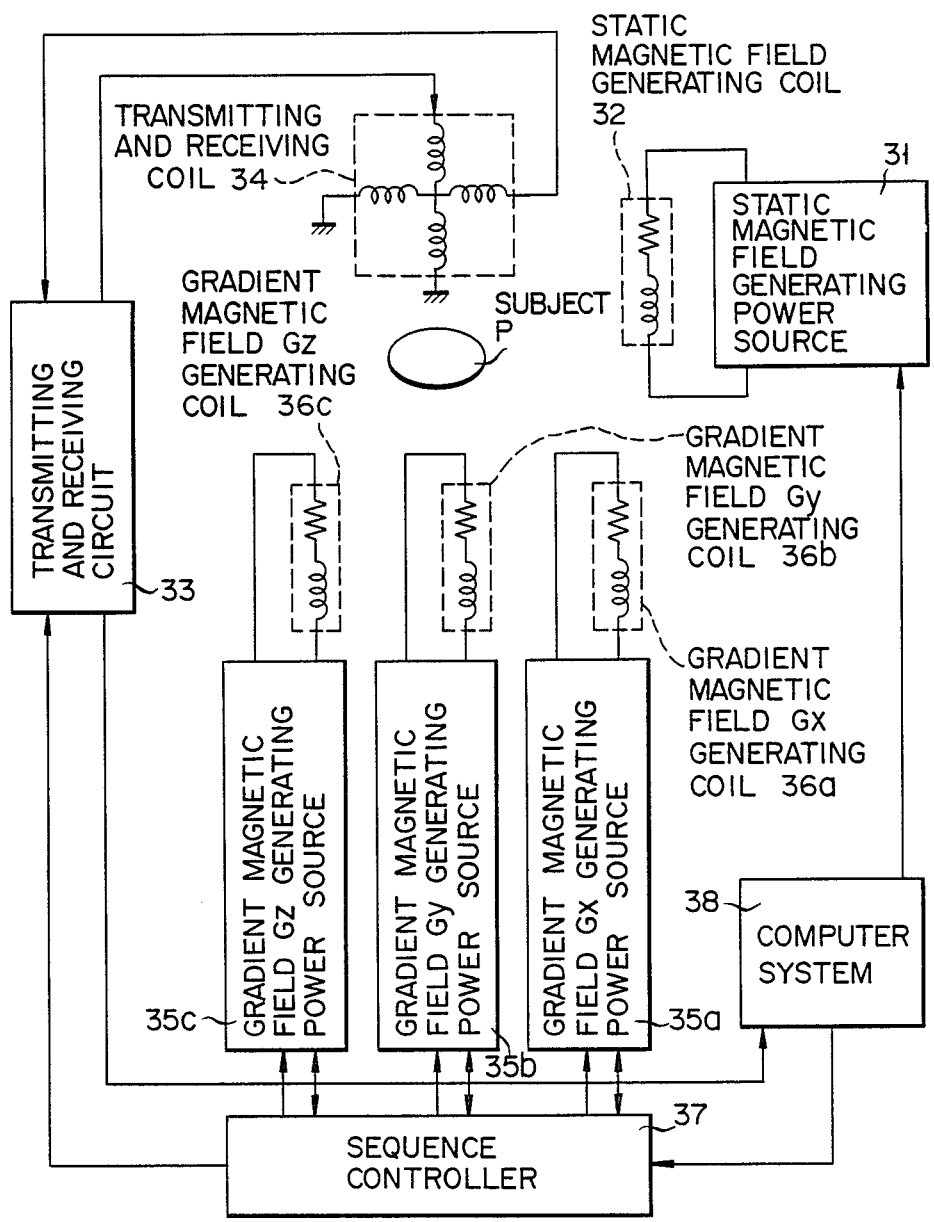
FIG. 3 is a block diagram of an MRI apparatus according to this invention.

As shown in FIG. 3, the system comprises coil 32 for generating a static uniform magnetic field; power source 31 for providing coil 32 with electric power; coils 36a, 36b, and 36c for generating gradient magnetic fields in X, Y, and Z directions; power sources 35a, 35b, and 35c for supplying electric power to coils 36a, 36b, and 36c, respectively; transmitting and receiving coil 34 and transmitting and receiving circuit 33 for transmitting an RF pulse and detecting an MR signal generated within a subject; sequence controller 37 for controlling power sources 35a, 35b and 35c and circuit 33; and computer system 38 for providing signals for driving power source 31 and controller 37, reconstructing an MR image using the MR signal detected by circuit 33 and displaying a reconstructed MR image. The subject to be examined is placed in the space to which magnetic fields are to be applied.

Figure 4:
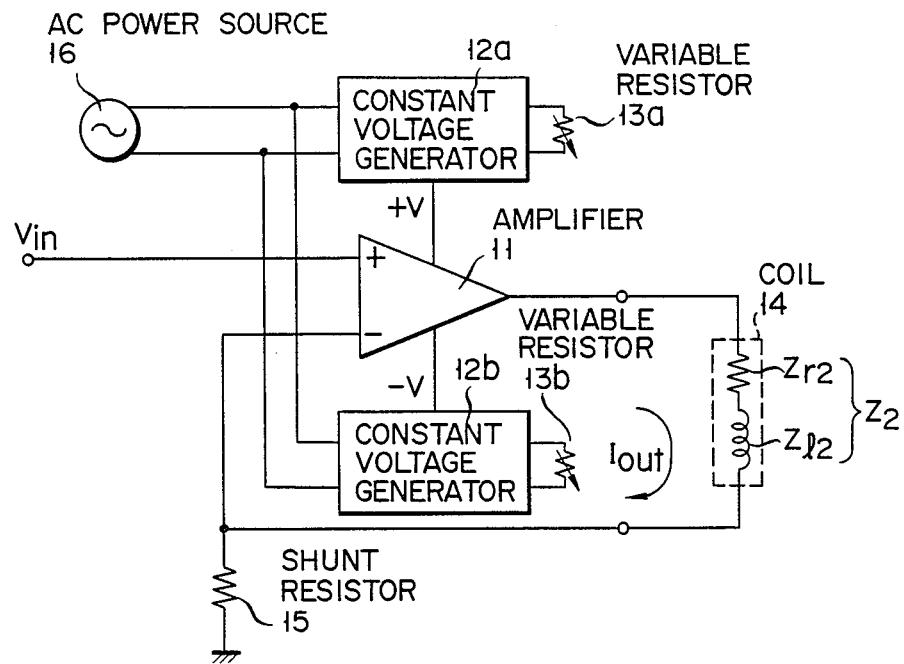
FIG. 4 shows one circuit arrangement of a gradient magnetic field generating power source of this invention.

One circuit arrangement of gradient field generating power sources 35a, 35b, and 35c is shown in FIG. 4. Constant voltage generators 12a and 12b convert an AC (alternating current) voltage of AC power source 16 to a DC (direct current) voltage which is then supplied to amplifier 11. Variable resistors 13a and 13b fixed to constant voltage generators 12a and 12b can be controlled by sequence controller 37. Input voltage Vin is output from controller 37 and amplified by amplifier 11, which is operated by the DC voltage output from constant voltage generators 12a and 12b. Output current Iout of amplifier 11 is applied to coil 14 having an impedance $Z_2$ (an inductance part $Z_{l2}$ and a resistance part $Z_{r2}$).

Figure 5:
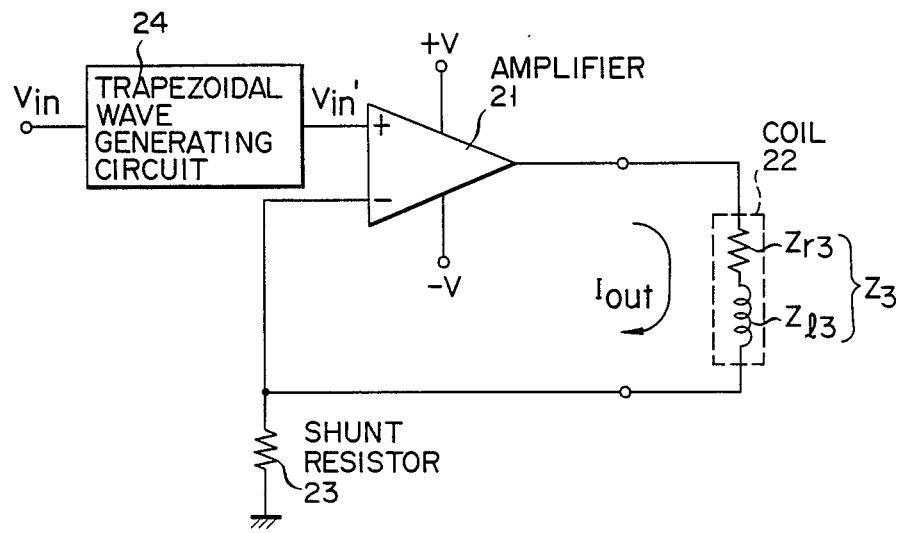
FIG. 5 shows another circuit arrangement of the gradient magnetic field generating power source of this invention.

FIG. 5 shows another circuit arrangement of the gradient field generating power source. Trapezoidal wave generating circuit 24 is provided on the input side of amplifier 21. As shown in FIG. 6, circuit 24 comprises amplifier 24a for amplifying input voltage Vin, constant current circuit 24b for outputting current corresponding to an output voltage of amplifier 24a, integrating circuit 24c for forming an output current waveform of circuit 24b to a trapezoidal waveform, and variable condenser 24d fixed to circuit 24c. Variable condenser 24d can be controlled by controller 37.

The operation of the power source will be described.

In FIG. 4, variable resistors 13a and 13b are controlled by sequence controller 37. When gradient field generating coils 36a, 36b and 36c have various impedances, sequence controller 37 detects the rise time of a current output to coils 36a, 36b and 36c and controls the current by use of variable resistors 13a and 13b so that the rise characteristics, for example, the rise time periods, of gradient fields Gx, Gy, and Gz agree among themselves. In this way, accurate position information can be provided to the MR signal.

In FIGS. 5 and 6, trapezoidal wave generating circuit 24 is arranged to form a waveform of input voltage Vin to trapezoidal wave voltage Vin'. Output current $I_{out}$ of amplifier 21 is applied to coil 22 having an impedance $Z_3$ (an inductance part $Z_{l3}$ and a resistance part $Z_{r3}$). In this case, as shown in FIG. 7, rise time $T_R$ of trapezoidal voltage Vin' is set to be the longest rise time of the currents supplied to gradient field generating coils 36a, 36b and 36c. As a result, the rise time periods of gradient magnetic fields Gx, Gy and Gz are made to be the same, thus providing accurate position information to the MR signal.

The present invention is not limited to the above embodiment, and various changes and modifications can be made within the spirit and scope of the invention.

What is claimed is:

1. A method for controlling waveforms of coil currents supplied to gradient magnetic field generating coil systems from magnetic field generating power sources, the method comprising the sequence of steps of:
   supplying the coil currents to the gradient magnetic field generating coil systems while detecting the waveforms of the coil currents;
   controlling the waveforms of the coil currents in response to the detected waveforms of the supplied coil currents to achieve a predetermined agreement among the waveforms of the coil currents; and
   supplying the coil currents having the controlled waveforms to the gradient magnetic field generating coil systems to generate gradient magnetic fields.

2. A method according to claim 1, wherein the waveforms of the coil currents supplied to the gradient magnetic field generating coil systems are controlled in accordance with a waveform rise time.

3. A method according to claim 2, wherein the rise time is set to be the longest rise time period among the detected waveforms of the coil currents.

4. A method according to claim 1, wherein the controlling step includes a step of regulating power source voltages of the magnetic field generating power sources.

5. A method according to claim 4, wherein the waveforms of the coil currents supplied to the gradient magnetic field generating coil systems are controlled in accordance with a waveform rise time.

6. A method according to claim 5, wherein the rise time is set to be the longest rise time period among the detected waveforms of the coil currents.

7. A method according to claim 1, wherein the controlling step includes a step of generating trapezoidal waves in accordance with the waveforms of the detected coil currents.

8. A method according to claim 7, wherein the waveforms of the coil currents supplied to the gradient magnetic field generating coil systems are controlled in accordance with a waveform rise time.

9. A method according to claim 8, wherein the rise time is set to be the longest rise time period among the detected waveforms of the coil currents.

10. A system for controlling waveforms of coil currents supplied to gradient magnetic field generating coil systems from magnetic field generating power sources, the system comprising:
    means for supplying the coil currents to the gradient magnetic field generating coil systems; and
    means for controlling the waveforms of the coil currents by detecting the waveforms of the supplied coil currents to achieve a predetermined agreement among the waveforms of the coil currents, and operating the supplying means to supply the coil currents having the agreed waveforms to the gradient magnetic field generating coil systems to generate the gradient magnetic fields.

11. A system according to claim 10, wherein the waveforms of the coil currents supplied to the gradient magnetic field generating coil systems are controlled in accordance with a waveform rise time.

12. A system according to claim 11, wherein the rise time is set to be the longest rise time period among the detected waveforms of the coil currents detected by the controlling means.

13. A system according to claim 10, wherein the controlling means includes means for regulating power source voltages of the magnetic field generating power sources.

14. A system according to claim 13, wherein the waveforms of the coil currents supplied to the gradient magnetic field generating coil systems are controlled in accordance with a waveform rise time.

15. A system according to claim 14, wherein the rise time is set to be the longest rise time period among the waveforms of the coil currents detected by the controlling means.

16. A system according to claim 10, wherein the controlling means includes means for generating the trapezoidal waves in accordance with the waveforms of the detected coil currents.

17. A system according to claim 16, wherein the waveforms of the coil currents supplied to the gradient magnetic field generating coil systems are controlled in accordance with a waveform rise time.

18. A system according to claim 17, wherein the rise time is set to be the longest rise time period among the waveforms of the coil currents detected by the controlling means.

* * * * *